(12) United States Patent
Ho et al.

(10) Patent No.: US 10,461,117 B2
(45) Date of Patent: Oct. 29, 2019

(54) SEMICONDUCTOR STRUCTURE AND METHOD FOR MANUFACTURING SEMICONDUCTOR STRUCTURE

(71) Applicant: XINTEC INC., Taoyuan (TW)

(72) Inventors: Yen-Shih Ho, Kaohsiung (TW); Tsang-Yu Liu, Zhubei (TW); Chia-Sheng Lin, Taoyuan (TW); Chaung-Lin Lai, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/848,600

(22) Filed: Dec. 20, 2017

(65) Prior Publication Data

US 2018/0175101 A1  Jun. 21, 2018

Related U.S. Application Data

(60) Provisional application No. 62/436,655, filed on Dec. 20, 2016.

(51) Int. Cl.
*H01L 27/146* (2006.01)
*H01L 21/683* (2006.01)
*H01L 23/00* (2006.01)

(52) U.S. Cl.
CPC .... *H01L 27/14687* (2013.01); *H01L 21/6835* (2013.01); *H01L 24/19* (2013.01); *H01L 24/20* (2013.01); *H01L 24/94* (2013.01); *H01L 27/1463* (2013.01); *H01L 27/14618* (2013.01); *H01L 27/14627* (2013.01); *H01L 27/14632* (2013.01); *H01L 27/14636* (2013.01); *H01L 27/14685* (2013.01); *H01L 2221/68372* (2013.01); *H01L 2221/68386* (2013.01); *H01L 2224/214* (2013.01); *H01L 2924/3511* (2013.01)

(58) Field of Classification Search
CPC ......... H01L 27/14618; H01L 27/14687; H01L 27/14632; H01L 27/14683; H01L 27/1463; H01L 27/14625–14629; H01L 21/6835; H01L 2221/68372; H01L 2221/68381; H01L 2221/68386
See application file for complete search history.

(56) References Cited

U.S. PATENT DOCUMENTS 6,307,243 B1 * 10/2001 Rhodes ............ H01L 27/14609
257/232
6,531,341 B1 * 3/2003 Peterson ............... B81B 7/0067
257/680
9,853,079 B2 * 12/2017 Oganesian ........ H01L 27/14625
(Continued)

*Primary Examiner* — Zandra V Smith
*Assistant Examiner* — Jeremy J Joy
(74) *Attorney, Agent, or Firm* — Liu & Liu

(57) ABSTRACT

A method for manufacturing a semiconductor structure includes the following steps. A first carrier is adhered to a first surface of a wafer by a first temporary bonding layer. A second surface of the wafer facing away from the first carrier is etched to form at least one through hole and at least one trench, in which a conductive pad of the wafer is exposed through the through hole. An isolation layer is formed on the second surface of the wafer, a sidewall of the through hole, and a sidewall of the trench. A second carrier is adhered to the second surface of the wafer by a second temporary bonding layer, and thus the through hole and the trench are covered by the second carrier. The first carrier and the first temporary bonding layer are removed.

15 Claims, 8 Drawing Sheets

(56) References Cited

U.S. PATENT DOCUMENTS

| | | | |
|---|---|---|---|
| 2001/0050717 A1* | 12/2001 | Yamada | H01L 27/14618 348/340 |
| 2003/0112714 A1* | 6/2003 | Harazono | G11B 7/22 369/18 |
| 2005/0158009 A1* | 7/2005 | Eichelberger | H01L 21/56 385/147 |
| 2007/0045515 A1* | 3/2007 | Farnworth | H01L 27/14618 250/208.1 |
| 2008/0211045 A1* | 9/2008 | Ono | H01L 27/14618 257/432 |
| 2008/0224192 A1* | 9/2008 | England | H01L 21/6835 257/294 |
| 2009/0068798 A1* | 3/2009 | Oliver | H01L 27/14618 438/127 |
| 2009/0134483 A1* | 5/2009 | Weng | H01L 27/1462 257/432 |
| 2009/0206431 A1* | 8/2009 | Bolken | G02B 7/02 257/432 |
| 2010/0230803 A1* | 9/2010 | Chien | H01L 21/56 257/693 |
| 2011/0156188 A1* | 6/2011 | Tu | H01L 27/14618 257/432 |
| 2011/0169159 A1* | 7/2011 | Lin | H01L 21/481 257/692 |
| 2011/0279815 A1* | 11/2011 | Tu | H01L 27/14618 356/213 |
| 2011/0291212 A1* | 12/2011 | Mihara | H01L 27/14618 257/432 |
| 2012/0049307 A1* | 3/2012 | Huang | H01L 27/14618 257/432 |
| 2012/0193741 A1* | 8/2012 | Borthakur | H01L 27/14621 257/433 |
| 2013/0127001 A1* | 5/2013 | Wen | H01L 31/0232 257/432 |
| 2014/0110807 A1* | 4/2014 | Uekawa | H01L 27/14618 257/432 |
| 2016/0020238 A1* | 1/2016 | Enichlmair | H01L 23/481 257/432 |
| 2016/0049436 A1* | 2/2016 | Lin | H01L 27/14636 257/432 |
| 2016/0163755 A1* | 6/2016 | Huang | H01L 27/14636 257/459 |
| 2017/0213864 A1* | 7/2017 | Chen | H01L 23/544 |

* cited by examiner

SEMICONDUCTOR STRUCTURE AND METHOD FOR MANUFACTURING SEMICONDUCTOR STRUCTURE

RELATED APPLICATIONS

This application claims priority to U.S. provisional Application Ser. No. 62/436,655, filed Dec. 20, 2016, which is herein incorporated by reference.

BACKGROUND

Field of Invention

The present invention relates to a method for manufacturing semiconductor structure.

Description of Related Art

Generally, in manufacturing a semiconductor structure that has an image sensing area, an optical glass is bonded to a wafer through a dam element, and then an etching process, a chemical vapor deposition (CVD) process, a physical vapor deposition (PVD) process, an electroplating process, or a grinding process is performed to the wafer. However, since coefficient thermal expansion (CTE) of the optical glass is different from that of the dam element, warpage may occur in the optical glass, the dam element, and the wafer after a high temperature process (e.g., CVD).

The aforementioned warpage is more obviously formed in a semiconductor structure that has a large image sensing area. Since the dam element is located outside the image sensing area, and an increase of the size of the image sensing area is referred to as a decrease of a supporting force of the dam element to the optical glass and the wafer, the warpage is prone to occur. As a result, after chip packages are formed by dicing the stacked optical glass, dam element, and wafer, product yield of the chip packages is difficult to improve.

SUMMARY

An aspect of the present invention is to provide a method for manufacturing a semiconductor structure.

According to an embodiment of the present invention, a method for manufacturing a semiconductor structure includes the following steps. (a) A first carrier is adhered to a first surface of a wafer by a first temporary bonding layer. (b) A second surface of the wafer facing away from the first carrier is etched to form at least one through hole and at least one trench, in which a conductive pad of the wafer is exposed through the through hole. (c) An isolation layer is formed on the second surface of the wafer, a sidewall of the through hole, and a sidewall of the trench. (d) A second carrier is adhered to the second surface of the wafer by a second temporary bonding layer, and thus the through hole and the trench are covered by the second carrier. (e) The first carrier and the first temporary bonding layer are removed.

In one embodiment of the present invention, the method further includes forming a redistribution layer on the isolation layer and the conductive pad.

In one embodiment of the present invention, step (a) includes irradiating the first temporary bonding layer by a first ultraviolet light with a first wavelength, thereby enabling the first temporary bonding layer to form an adhesive force.

In one embodiment of the present invention, step (e) includes irradiating the first temporary bonding layer by a second ultraviolet light with a second wavelength, thereby eliminating the adhesive force of the first temporary bonding layer, in which the second wavelength is different from the first wavelength.

In one embodiment of the present invention, step (d) includes irradiating the second temporary bonding layer by a first ultraviolet light with a first wavelength, thereby enabling the second temporary bonding layer to form an adhesive force.

In one embodiment of the present invention, the method further includes disposing an optical element that has a dam element on the first surface of the wafer, thereby enabling the dam element to be located between the optical element and the first surface, in which the dam element covers the conductive pad and the trench, and surrounds an image sensing area of the wafer.

In one embodiment of the present invention, the method further includes removing the second carrier and the second temporary bonding layer after the optical element is disposed on the first surface of the wafer.

In one embodiment of the present invention, the removing the second carrier includes irradiating the second temporary bonding layer by a second ultraviolet light with a second wavelength, thereby eliminating the adhesive force of the second temporary bonding layer, in which the second wavelength is different from the first wavelength.

In one embodiment of the present invention, the method further includes forming an insulating layer that covers the redistribution layer, the through hole, and the trench after the second carrier and the second temporary bonding layer are removed.

In one embodiment of the present invention, the forming the insulating layer includes filling the trench with the insulating layer.

In one embodiment of the present invention, the method further includes patterning the insulating layer, thereby enabling the insulating layer has at least one opening that exposes the redistribution layer.

In one embodiment of the present invention, the method further includes forming a conductive structure on the redistribution layer that is in the opening of the insulating layer.

In one embodiment of the present invention, the method further includes dicing the optical element, the dam element, and the insulating layer in a vertical direction along the trench to form at least one chip package after the conductive structure is formed.

In one embodiment of the present invention, the optical element is made of glass.

In one embodiment of the present invention, a light transmittance of the optical element is greater than a light transmittance of the first carrier, and is greater than a light transmittance of the second carrier.

In one embodiment of the present invention, a thickness of the optical element is smaller than a thickness of the first carrier, and is smaller than a thickness of the second carrier.

In the aforementioned embodiments of the present invention, since the dam element and the optical element are not disposed yet before the through hole, the trench, and the isolation layer are formed in the method for manufacturing the semiconductor structure, and the first temporary bonding layer is used to adhere the first carrier to the wafer, the first carrier can provide a sufficient supporting force to the wafer and prevents the wafer from warpage caused by a high temperature. Moreover, after the isolation layer is formed, the second temporary bonding layer may be used to adhere the second carrier to the second surface of the wafer. Through a supporting force of the second carrier to the wafer, the first carrier may be removed and the wafer is not bent to be cracked. Since there is no high temperature process after the first carrier is removed, disposing the optical element with the dam element on the first surface of the wafer does not cause warpages of the optical element, the dam element, and the wafer in a subsequent manufacturing process.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
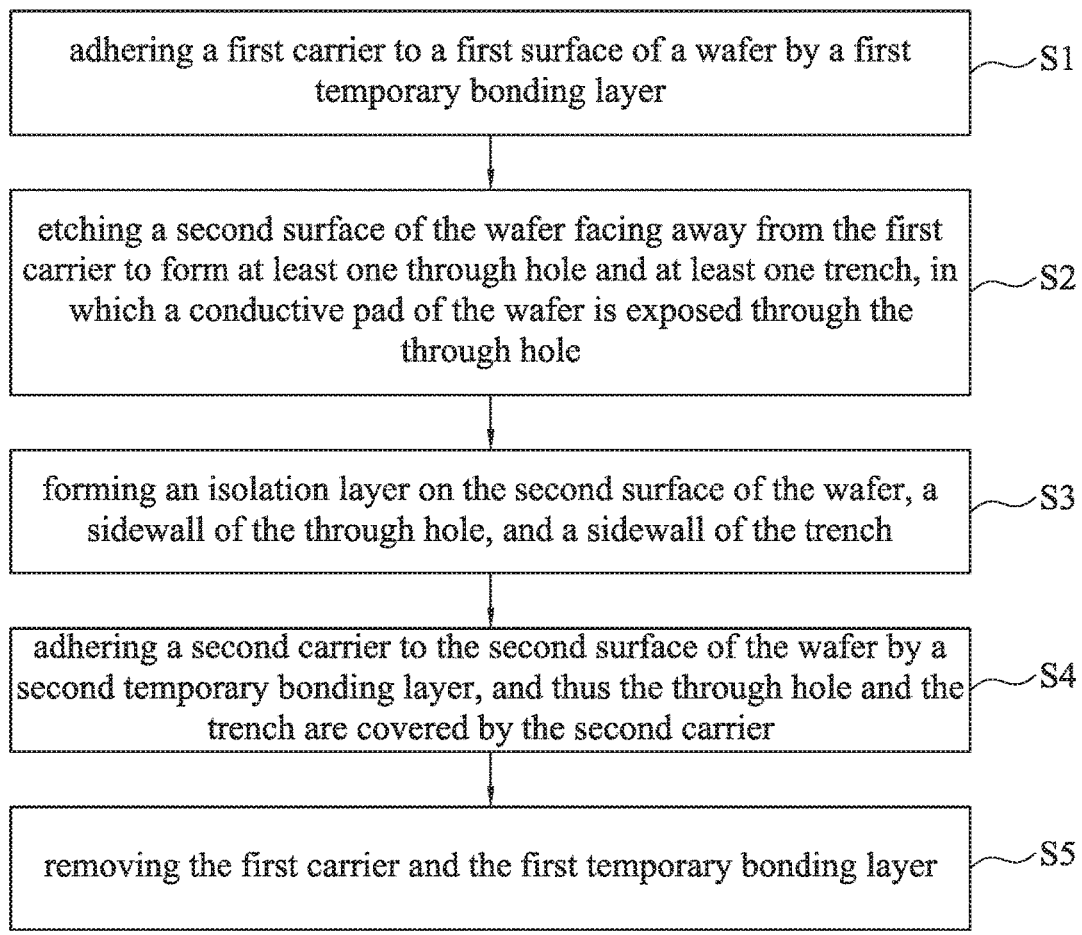
FIG. 1 is a flowchart of a method for manufacturing a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a flowchart of a method for manufacturing a semiconductor structure according to one embodiment of the present invention. The method for manufacturing the semiconductor structure includes the following steps. In step S1, a first carrier is adhered to a first surface of a wafer by a first temporary bonding layer. Thereafter, in step S2, a second surface of the wafer facing away from the first carrier is etched to form at least one through hole and at least one trench, in which a conductive pad of the wafer is exposed through the through hole. Next, in step S3, an isolation layer is formed on the second surface of the wafer, a sidewall of the through hole, and a sidewall of the trench. Afterwards, in step S4, a second carrier is adhered to the second surface of the wafer by a second temporary bonding layer, and thus the through hole and the trench are covered by the second carrier. Sequentially, in step S5, the first carrier and the first temporary bonding layer are removed.

In the following description, the aforementioned steps will be explained.

Figure 2:
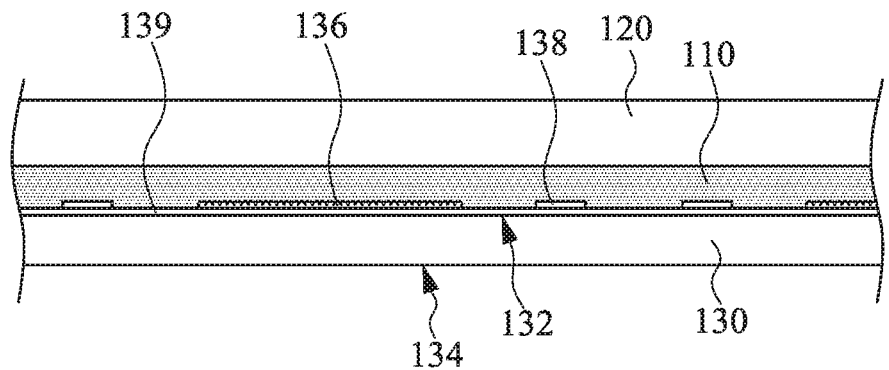
FIGS. 2 to 10 are cross-sectional views of intermediate stages in a method for manufacturing a semiconductor structure according to one embodiment of the present invention.

FIGS. 2 to 10 are cross-sectional views of intermediate stages in a method for manufacturing a semiconductor structure according to one embodiment of the present invention. As shown in FIG. 2, a wafer 130 has a first surface 132, a second surface 134 that is opposite the first surface 132, an image sensing area 136, a conductive pad 138, and an isolation layer 139. The image sensing area 136, the conductive pad 138, and the isolation layer 139 are located on the first surface 132. The wafer 130 may be made of a material including silicon, such as a silicon wafer. A first temporary bonding layer 110 is located between a first carrier 120 and the wafer 130. In other words, the first carrier 120 is adhered to the first surface 132 of the wafer 130 by the first temporary bonding layer 110. Ultraviolet light with different wavelengths may enable the first temporary bonding layer 110 to form an adhesive force, or may eliminate an adhesive force of the first temporary bonding layer 110. In this step, a first ultraviolet light with a first wavelength may be used to irradiate the first temporary bonding layer 110, and thus the first temporary bonding layer 110 forms an adhesive force.

The first carrier 120 may provide a supporting force to the wafer 130, thereby preventing the wafer 130 from being cracked in a subsequent manufacturing process. Furthermore, the first carrier 120 may protect the image sensing area 136 and the conductive pad 138 of the wafer 130, and prevents the image sensing area 136 and the conductive pad 138 from being damaged in a subsequent manufacturing process. In this embodiment, the first carrier 120 may be made of glass or acrylic.

Figure 3:
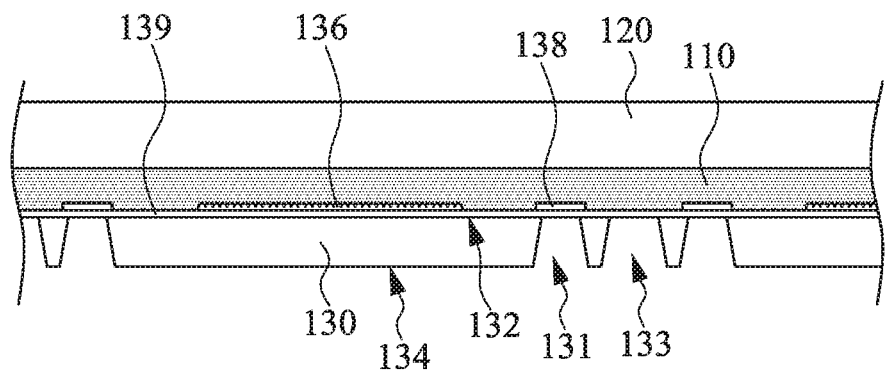

As shown in FIG. 2 and FIG. 3, after the first carrier 120 is adhered to the wafer 130 through the first temporary bonding layer 110, the second surface 134 of the wafer 130 may be etched to form at least one through hole 131 and at least one trench 133, thereby enabling the conductive pad 138 of the wafer 130 to be exposed through the through hole 131. That is, a position of the through hole 131 corresponds to a position of the conductive pad 138. In addition, the image sensing area 136 is closer to the through hole 131 than the trench 133, and at least portion of the trench 133 is between two through holes 131.

Figure 4:
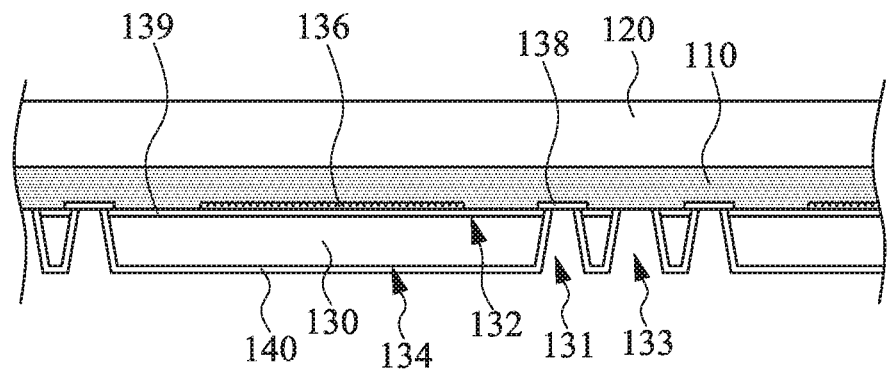

As shown in FIG. 3 and FIG. 4, after the through hole 131 and the trench 133 are formed, an isolation layer 140 may be formed on the second surface 134 of the wafer 130, a sidewall of the through hole 131, and a sidewall of the trench 133. In this step, the isolation layer 140 may cover the second surface 134 of the wafer 130, the sidewall of the through hole 131, and the sidewall of the trench 133 through chemical vapor deposition (CVD), and then the isolation layer 140 covering a bottom surface of the conductive pad 138 is removed by a patterning process, and the resulting structure is shown in FIG. 4. The patterning process may include exposure, development, and etching in photolithography. In this embodiment, the isolation layer 140 may be made of silicon dioxide, and the isolation layer 139 may be made of the same material as the isolation layer 140.

Figure 5:
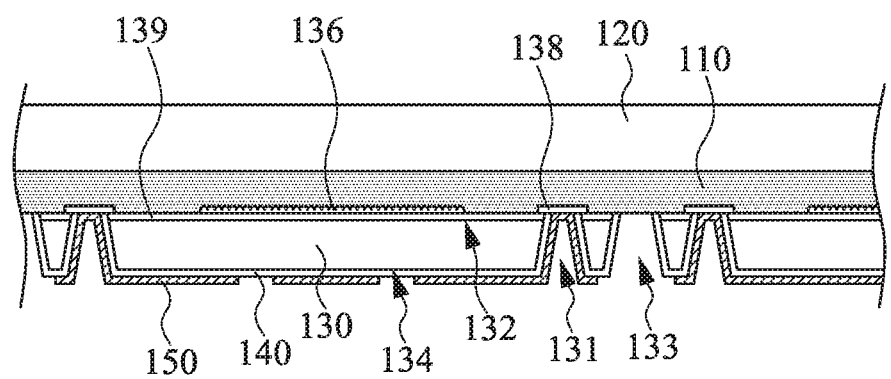

As shown in FIG. 4 and FIG. 5, after the isolation layer 140 is formed, a redistribution layer 150 may be formed on the isolation layer 140 and the conductive pad 138, and is in an electrical contact with the conductive pad 138. The redistribution layer 150 may be made of a material including aluminum, and may be formed by electroplating, but the present invention is not limited in this regard.

Figure 6:
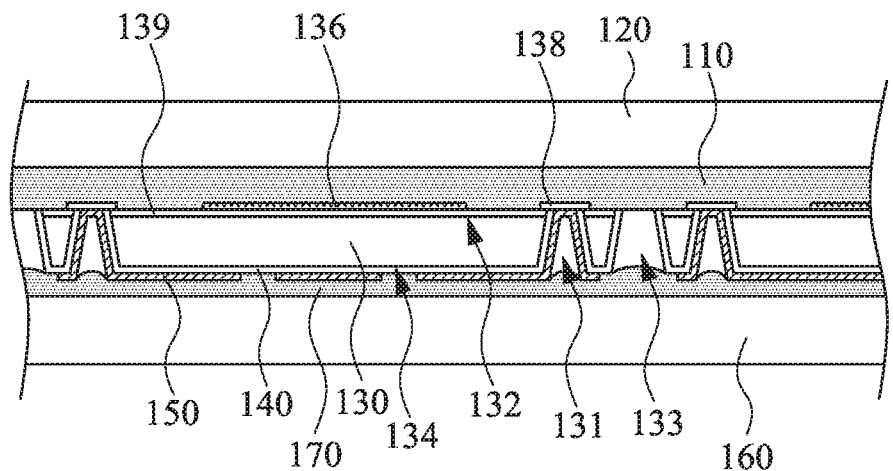

As shown in FIG. 5 and FIG. 6, after the redistribution layer 150 is formed, a second temporary bonding layer 170 may be used to adhere a second carrier 160 to the second surface 134 of the wafer 130, and thus the through hole 131 and the trench 133 are covered by the second carrier 160. The second temporary bonding layer 170 is located between the second carrier 160 and the wafer 130. In other words, the second carrier 160 is adhered to the second surface 134 of the wafer 130 through the second temporary bonding layer 170. The second temporary bonding layer 170 may be made of the same material as the first temporary bonding layer 110. Ultraviolet light with different wavelengths may enable the second temporary bonding layer 170 to form an adhesive force, or may eliminate an adhesive force of the second temporary bonding layer 170. In this step, the first ultraviolet light with the first wavelength may be used to irradiate the second temporary bonding layer 170, and thus the second temporary bonding layer 170 forms an adhesive force.

The second carrier 160 may provide a supporting force to the wafer 130, thereby preventing the wafer 130 from being cracked in a subsequent manufacturing process. Furthermore, the second carrier 160 may protect the redistribution layer 150, and prevents the redistribution layer 150 from being damaged in a subsequent manufacturing process. In this embodiment, the second carrier 160 may be made of glass or acrylic.

Figure 7:
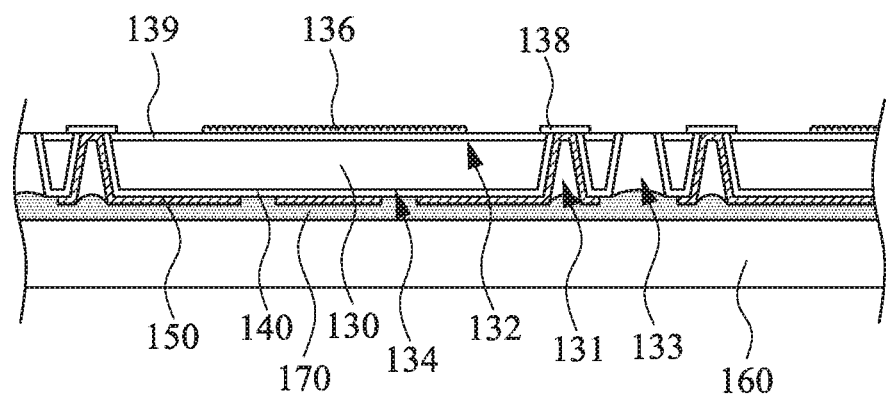

As shown in FIG. 6 and FIG. 7, after the second carrier 160 is adhered to the bottom of the wafer 130 by the second temporary bonding layer 170, the first carrier 120 and the first temporary bonding layer 110 above the wafer 130 may be removed. In this step, a second ultraviolet light with a second wavelength may be used to irradiate the first temporary bonding layer 110, thereby eliminating the adhesive force of the first temporary bonding layer 110, in which the second wavelength is different from the first wavelength. After the first carrier 120 is removed, the first carrier 120 may be repeatedly used on another wafer to save material cost.

Figure 8:
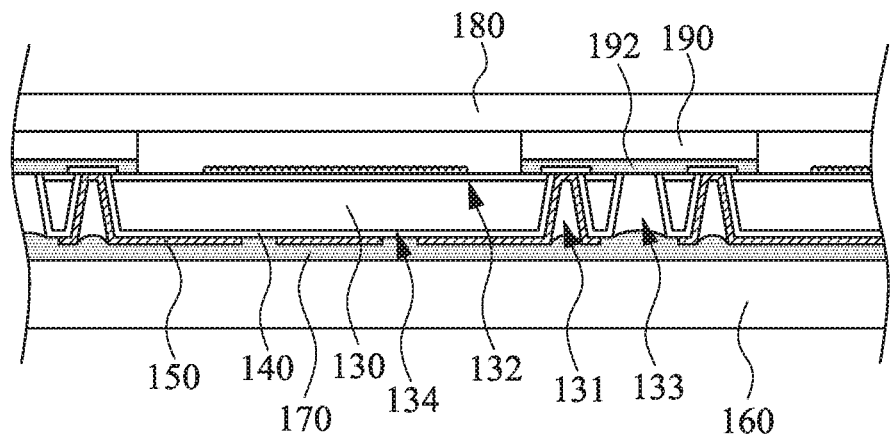

As shown in FIG. 7 and FIG. 8, after the first carrier 120 and the first temporary bonding layer 110 are removed, an optical element 180 that has a dam element 190 may be disposed on the first surface 132 of the wafer 130, thereby enabling the dam element 190 to be located between the optical element 180 and the first surface 132. The dam element 190 covers the conductive pad 138 and the trench 133, and surrounds the image sensing area 136 of the wafer 130. The dam element 190 may be fixed to the first surface 132 of the wafer 130 by utilizing an adhesive 192. Before the dam element 190 is bonded to the wafer 130, the dam element 190 may be disposed on a surface of the optical element 180.

In this embodiment, the dam element 190 may be made of a material including epoxy. The optical element 180 is made of glass, and allows light to pass through, and hence the underlying image sensing area 136 can detect the light. Therefore, requirements for physical properties of the optical element 180 are different from that of the first carrier 120 (see FIG. 6) and the second carrier 160 that are utilized to support the wafer 130. For example, a light transmittance of the optical element 180 is greater than a light transmittance of the first carrier 120, and is greater than a light transmittance of the second carrier 160. Moreover, a thickness of the optical element 180 is smaller than a thickness of the first carrier 120, and is smaller than a thickness of the second carrier 160, thereby reducing a thickness of the entire semiconductor structure. The semiconductor structures shown in FIG. 7 and FIG. 8 may be shipped out in wafer level packages as deemed necessary by manufacturers.

The optical element 180 may be an anti-reflection (AR) glass or an infrared (IR) glass, but the present invention is not limited in this regard. Moreover, the optical element 180 may be made of a material including fuel silica.

In the method for manufacturing the semiconductor structure, since the dam element 190 and the optical element 180 are not disposed yet before the through hole 131, the trench 133, and the isolation layer 140 are formed, and the first temporary bonding layer 110 is used to adhere the first carrier 120 to the wafer 130, the first carrier 120 can provide a sufficient supporting force to the wafer 130 and prevents the wafer 130 from warpage caused by a high temperature (e.g., a CVD process that forms the isolation layer 140).

Moreover, after the isolation layer 140 is formed, the second temporary bonding layer 170 may be used to adhere the second carrier 160 to the second surface 134 of the wafer 130. Through a supporting force of the second carrier 160 to the wafer 130, the first carrier 120 may be removed and the wafer 130 is not bent to be cracked. Since there is no high temperature process after the first carrier 120 is removed, disposing the optical element 180 with the dam element 190 on the first surface 132 of the wafer 130 does not cause warpages of the optical element 180, the dam element 190, and the wafer 130 in a subsequent manufacturing process.

Figure 9:
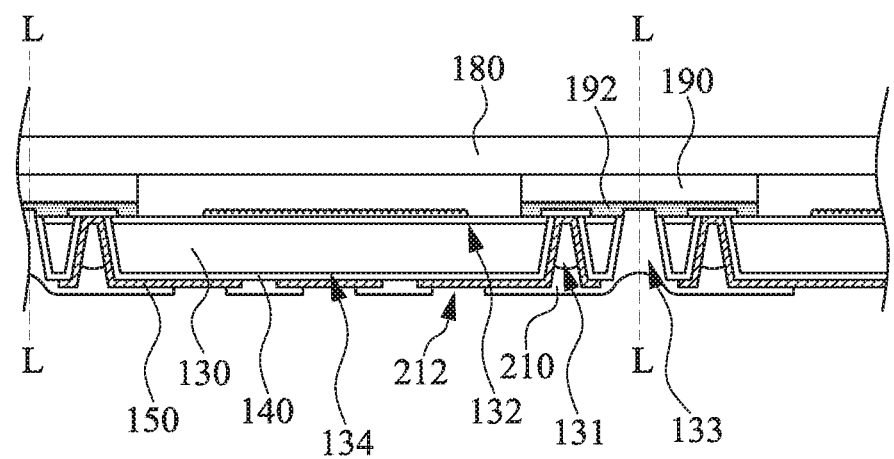

As shown in FIG. 8 and FIG. 9, after the optical element 180 is disposed on the first surface 132 of the wafer 130, the second carrier 160 and the second temporary bonding layer 170 may be removed. In this step, the second ultraviolet light with the second wavelength may be used to irradiate the second temporary bonding layer 170, thereby eliminating the adhesive force of the second temporary bonding layer 170. After the second carrier 160 is removed, the second carrier 160 may be repeatedly used on another wafer to save material cost.

After the second carrier 160 and the second temporary bonding layer 170 are removed, an insulating layer 210 may be formed to cover the redistribution layer 150, the through hole 131, and the trench 133. In this step, the trench 133 may be filled with the insulating layer 210. Thereafter, the insulating layer 210 may be patterned to have at least one opening 212 that exposes the redistribution layer 150. In this embodiment, the insulating layer 210 may be made of epoxy, such as a solder mask.

Figure 10:
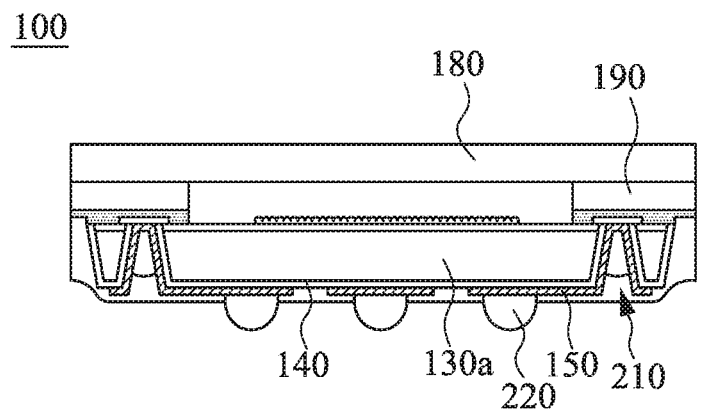

As shown in FIG. 9 and FIG. 10, after the opening 212 of the insulating layer 210 is formed, a conductive structure 220 may be formed on the redistribution layer 150 that is in the opening 212 of the insulating layer 210. The conductive structure 220 may be a conductive ball (e.g., a solder ball) or a conductive bump of a ball grid array (BGA), and the present invention is not limited to the shape or material of the conductive structure 220.

After the conductive structure 220 is formed, the optical element 180, the dam element 190, and the insulating layer 210 may be diced in a vertical direction along the trench 133. For example, a cutter may be used to dice the optical element 180, the dam element 190, and the insulating layer 210 along line L-L, thereby forming a chip package 100 of FIG. 10. After the dicing process, the wafer 130 may form at least one chip 130a of FIG. 10.

The conductive structure 220 may be electrically connected to an external electronic device (e.g., a printed circuit board), thereby transmitting signals to the conductive pad 138 of the chip package 100 through the redistribution layer 150. In this embodiment, the chip package 100 may be an image sensing chip (e.g., a CMOS chip), but the present invention is not limited in this regard.

Figure 11:
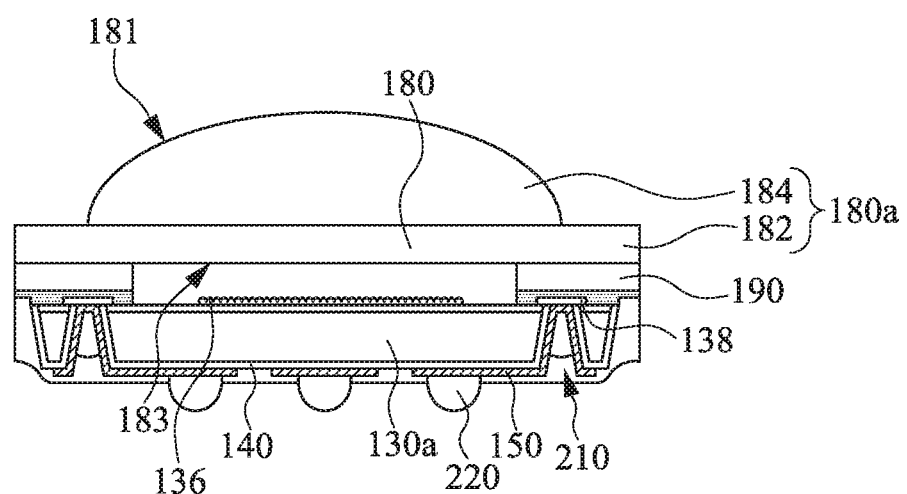
FIG. 11 is a cross-sectional view of a chip package according to one embodiment of the present invention.

FIG. 11 is a cross-sectional view of a chip package 100a according to one embodiment of the present invention. The chip package 100a is a semiconductor structure, and includes a chip 130a, a dam element 190, and an optical element 180a. A surface of the chip 130a has a conductive pad 138 and an image sensing area 136. The dam element 190 covers the conductive pad 138 and surrounds the image sensing area 136. The optical element 180a is disposed on the dam element 190 and covers the image sensing area 136. The optical element 180a has a top surface 181 and a bottom surface 183. The bottom surface 183 faces the image sensing area 136, and the top surface 181 faces away from the image sensing area 136. The difference between this embodiment and the embodiment shown in FIG. 10 is that the top surface 181 of the optical element 180a has curved shape. In this embodiment, the optical element 180a includes a support portion 182 and a lens portion 184. The support portion 182 is located on the dam element 190 and has the bottom surface 183. The lens portion 184 is located on the support portion 182 and has the top surface 181, and covers the image sensing area 136.

Figure 12:
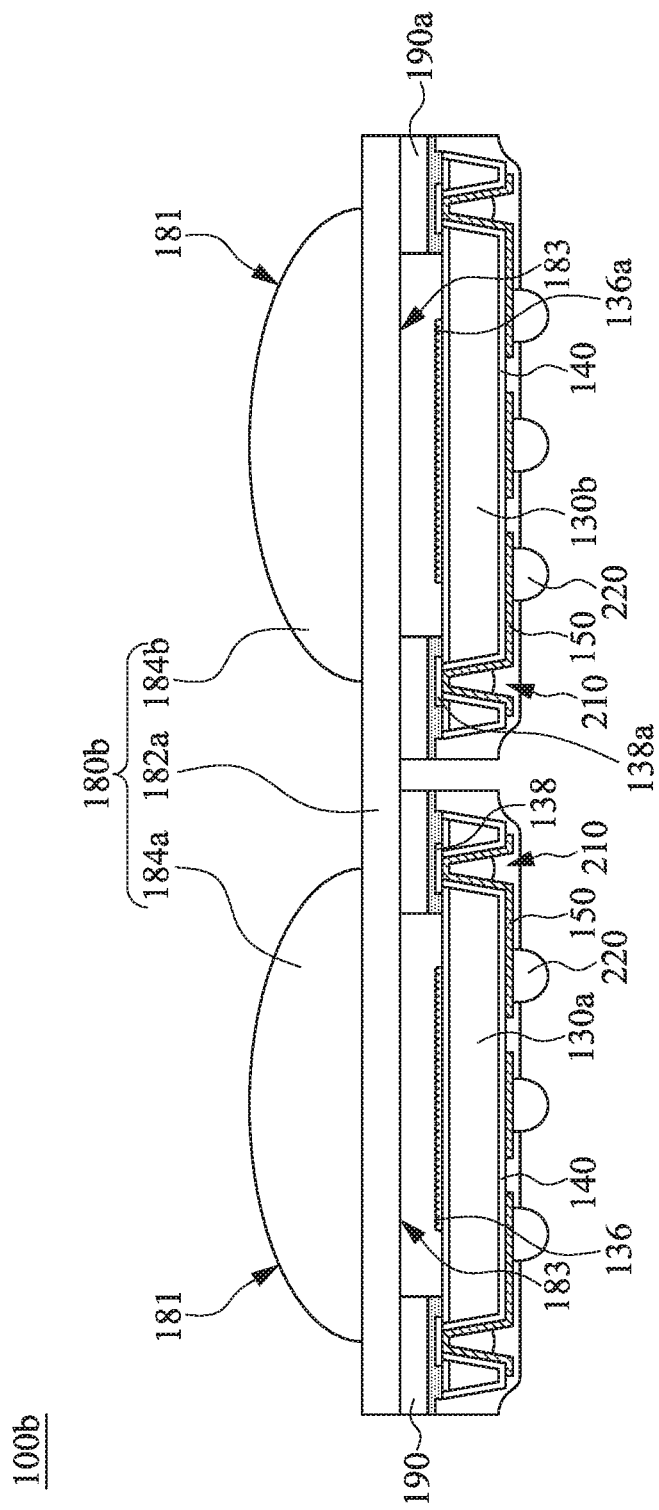
FIG. 12 is a cross-sectional view of a chip package according to one embodiment of the present invention.

FIG. 12 is a cross-sectional view of a chip package 100b according to one embodiment of the present invention. The chip package 100b includes the chip 130a, the dam element 190, and an optical element 180b. The difference between this embodiment and the embodiment shown in FIG. 11 is that the chip package 100b further includes a chip 130b and a dam element 190a. The chip 130b is next to the chip 130a. A surface of the chip 130b has a conductive pad 138a and an image sensing area 136a. The dam element 190a covers the conductive pad 138a and surrounds the image sensing area 136a. Moreover, the optical element 180b extends onto the dam element 190a from the dam element 190, and covers the image sensing area 136a of the chip 130b. A portion of the bottom surface 183 of the optical element 180b faces the image sensing area 136a, and a portion of the top surface 181 faces away from the image sensing area 136a. In this embodiment, the optical element 180b includes a support portion 182a and two lens portions 184a and 184b. The support portion 182a is located on the dam element 190 and the dam element 190a, and has the bottom surface 183. The lens portions 184a and 184b are located on the support portion 182a, and have the top surface 181. The lens portions 184a and 184b respectively cover the image sensing areas 136 and 136a.

Figure 13:
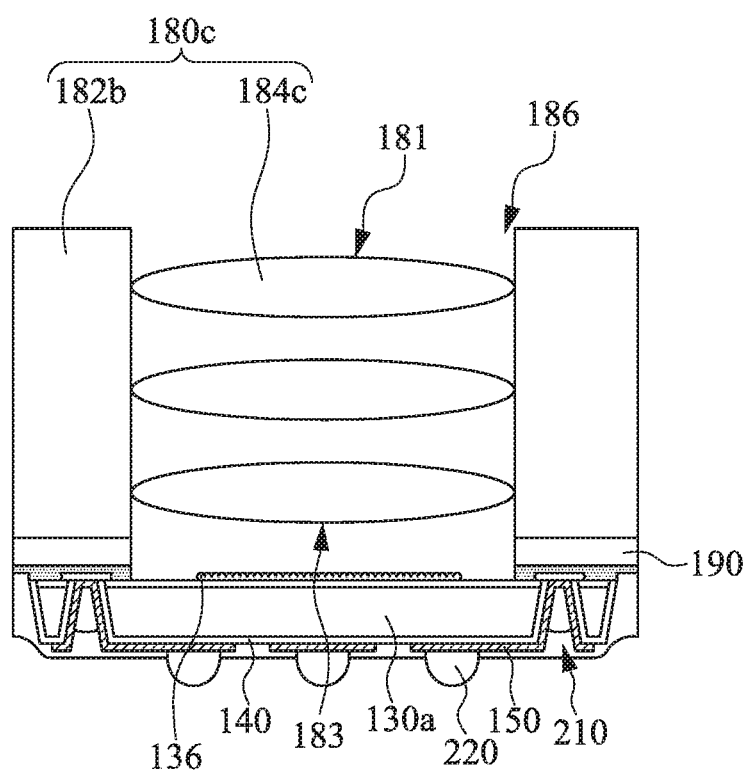
FIG. 13 is a cross-sectional view of a chip package according to one embodiment of the present invention.

FIG. 13 is a cross-sectional view of a chip package 100c according to one embodiment of the present invention. The chip package 100c includes the chip 130a, the dam element 190, and an optical element 180c. The difference between this embodiment and the embodiment shown in FIG. 11 is that the optical element 180c includes a support portion 182b and plural lens portions 184c. The support portion 182b is located on the dam element 190 and an accommodating space 186 is surrounded by the support portion 182b. The lens portions 184c are physically connected to the support portion 182b and are located in the accommodating space 186. The lens portions 184c overlaps the image sensing area 136. The present invention is not limited to the number of the lens portions 184c. In addition, one of the lens portions 184c (i.e., the top lens portion 184c) has the top surface 181, and one of the lens portions 184c (i.e., the bottom lens portion 184c) has the bottom surface 183.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A method for manufacturing semiconductor structure, comprising:
   (a) adhering a first carrier to a first surface of a wafer by a first temporary bonding layer;
   (b) etching a second surface of the wafer facing away from the first carrier to form at least one through hole and at least one trench, wherein a conductive pad of the wafer is exposed through the through hole;
   (c) forming an isolation layer on the second surface of the wafer, a sidewall of the through hole, and a sidewall of the trench;
   (d) forming a redistribution layer on the isolation layer and the conductive pad;
   (e) adhering a second carrier to the second surface of the wafer by a second temporary bonding layer, wherein the through hole and the trench are covered by the second carrier;
   (f) removing the first carrier and the first temporary bonding layer;
   (g) disposing an optical element that has a dam element on the first surface of the wafer;
   (h) removing the second carrier and the second temporary bonding layer after the optical element is disposed on the first surface of the wafer; and
   (i) forming an insulating layer that covers the redistribution layer, the through hole, and the trench after the second carrier and the second temporary bonding layer are removed.

2. The method for manufacturing semiconductor structure of claim 1, wherein step (a) comprises:
   irradiating the first temporary bonding layer by a first ultraviolet light with a first wavelength, thereby enabling the first temporary bonding layer to form an adhesive force.

3. The method for manufacturing semiconductor structure of claim 2, wherein step (f) comprises:
   irradiating the first temporary bonding layer by a second ultraviolet light with a second wavelength, thereby eliminating the adhesive force of the first temporary bonding layer, wherein the second wavelength is different from the first wavelength.

4. The method for manufacturing semiconductor structure of claim 1, wherein step (e) comprises:
   irradiating the second temporary bonding layer by a first ultraviolet light with a first wavelength, thereby enabling the second temporary bonding layer to form an adhesive force.

5. The method for manufacturing semiconductor structure of claim 4, wherein step (g) comprises:
   enabling the dam element to be located between the optical element and the first surface, wherein the dam element covers the conductive pad and the trench, and surrounds an image sensing area of the wafer.

6. The method for manufacturing semiconductor structure of claim 4, wherein the removing the second carrier comprises:
   irradiating the second temporary bonding layer by a second ultraviolet light with a second wavelength, thereby eliminating the adhesive force of the second temporary bonding layer, wherein the second wavelength is different from the first wavelength.

7. The method for manufacturing semiconductor structure of claim 1, wherein step (i) comprises:
   filling the trench with the insulating layer.

8. The method for manufacturing semiconductor structure of claim 1, further comprising:
   patterning the insulating layer, thereby enabling the insulating layer has at least one opening that exposes the redistribution layer.

9. The method for manufacturing semiconductor structure of claim 8, further comprising:
   forming a conductive structure on the redistribution layer that is in the opening of the insulating layer.

10. The method for manufacturing semiconductor structure of claim 9, further comprising:
dicing the optical element, the dam element, and the insulating layer in a vertical direction along the trench to form at least one chip package after the conductive structure is formed.

11. The method for manufacturing semiconductor structure of claim 1, wherein the optical element is made of glass.

12. The method for manufacturing semiconductor structure of claim 1, wherein a light transmittance of the optical element is greater than a light transmittance of the first carrier, and is greater than a light transmittance of the second carrier.

13. The method for manufacturing semiconductor structure of claim 1, wherein a thickness of the optical element is smaller than a thickness of the first carrier, and is smaller than a thickness of the second carrier.

14. The method for manufacturing semiconductor structure of claim 1, wherein the optical element is an anti-reflection (AR) glass or an infrared (IR) glass.

15. The method for manufacturing semiconductor structure of claim 1, wherein the optical element is made of a material comprising fuel silica.

* * * * *